(12) United States Patent
Ishihara et al.

(10) Patent No.: US 7,456,626 B2
(45) Date of Patent: Nov. 25, 2008

(54) MEASUREMENT DEVICE AND METHOD FOR DISPLAYING MEASUREMENT RESULT

(75) Inventors: Gentaro Ishihara, Yokohama (JP); Tohru Mori, Yokohama (JP)

(73) Assignee: Yokogawa Electric Corporation, Tokyo (JP)

( * ) Notice: Subject to any disclaimer, the term of this patent is extended or adjusted under 35 U.S.C. 154(b) by 189 days.

(21) Appl. No.: 11/101,307

(22) Filed: Apr. 7, 2005

(65) Prior Publication Data

US 2005/0179683 A1 Aug. 18, 2005

Related U.S. Application Data

(63) Continuation of application No. PCT/JP03/13059, filed on Oct. 10, 2003.

(30) Foreign Application Priority Data

Oct. 10, 2002 (JP) .......................... P2002-297153

(51) Int. Cl.
*G01R 23/00* (2006.01)

(52) U.S. Cl. .................. 324/76.19; 324/76.22

(58) Field of Classification Search .............. 324/76.19, 324/76.22, 121 R, 76.18, 418, 619; 345/418, 345/619
See application file for complete search history.

(56) References Cited

U.S. PATENT DOCUMENTS 5,004,975 A * 4/1991 Jordan .................... 324/121 R
5,579,463 A * 11/1996 Takano et al. ............... 345/440
6,856,400 B1 * 2/2005 Froggatt ...................... 356/477
6,891,149 B1 * 5/2005 Lewis et al. ............. 250/227.14
2002/0080149 A1 * 6/2002 Alexander et al. .......... 345/634
2002/0135788 A1 * 9/2002 Arakawa et al. ............. 358/1.1
2004/0167727 A1 * 8/2004 Pickerd ....................... 702/57

FOREIGN PATENT DOCUMENTS

| JP | 03273113 A | 12/1991 |
|---|---|---|
| JP | 9068438 | 3/1997 |
| JP | 01184015 A | 3/1999 |
| JP | 2002014118 | 1/2002 |

* cited by examiner

*Primary Examiner*—Vincent Q Nguyen
(74) *Attorney, Agent, or Firm*—Grossman, Tucker, Perreault & Pfleger, PLLC (57) ABSTRACT

A measurement device is provided for measuring a predetermined physical quantity which is contained in the measurement signal over a predetermined measurement range which relates to a specific property for the physical quantity according to the measurement signal which is obtained from an object for measurement so as to display the measurement result as an image in a measurement display which comprises a display range setting section which sets the measurement range, a measurement display generating section which generates the measurement display by using the measurement result in a display range which is set by the measurement range setting section among the measurement result which is measured over the measurement range which is set by the measurement range setting section, and a display section which displays the measurement display which is generated by the measurement display generating section. By doing this, it is possible to enhance an operability of the measurement device by varying the display range of the measurement result freely without changing the measurement scale.

23 Claims, 7 Drawing Sheets

↓ CHANGE DISPLAY SCALE
(MEASUREMENT SCALE IS UNCHANGED)

MEASUREMENT DEVICE AND METHOD FOR DISPLAYING MEASUREMENT RESULT

This application is a continuation application of International Application PCT/JP03/13059 filed Oct. 10, 2003, which itself claims priority to Japanese Application P2002-297153 filed Oct. 10, 2002.

TECHNICAL FIELD

The present invention relates to a measurement device and a method for displaying the measurement result.

BACKGROUND ART

As public known, there is an optical spectrum analyzer as a measurement device for measuring a wavelength component which is contained in an optical signal and a level (optical intensity) of the wavelength component. The optical spectrum analyzer disperses the optical signal into fine wavelength components by using the spectrometer, converts each optical intensity to an electric signals by receiving each wavelength component and generates a measurement display which indicates a relationship for the wavelength and the optical intensity by a horizontal axis (wavelength axis) and a vertical axis (optical intensity axis) according to these electric signals so as to show as an image. Some of these optical spectrum analyzers display an optical frequency which is indicated in the horizontal axis instead of the wavelength When an optical signal is measured by using such an optical spectrum analyzer, an operator sets a measurement scale (measurement range) of the optical spectrum analyzer by operating and inputting the wavelength range which is supposed to be measured. In addition, an optical intensity over the above measurement scale is measured by the optical spectrum analyzer by operating and inputting the measurement starting command. When the measurement of the optical intensity over the above measurement scale is completed, the optical spectrum analyzer generates the measurement display according to the measurement result which is stored in an internal memory so as to display its image. Here, such an optical spectrum analyzer is disclosed in a commonly know document such as Japanese Patent No. 287709.

By the way, a function for changing the display range for the measurement result which is obtained in advance by changing the measurement scale after performing the measurement is provided in the above conventional optical spectrum analyzer. For example, when a display range which is larger than the measurement scale under condition that the measurement is performed is operated and input, the optical spectrum analyzer display the wavelength range for the measurement result in a contracted manner. That is, in such a case, the measurement display which is displayed on the wavelength axis is set to have a larger range than the measurement scale setting section under condition that the measurement is performed; therefore, the wavelength range for the measurement result is compressed. In contrast, a display range which is narrower than the measurement scale under condition that the measurement is performed is operated and input, the optical spectrum analyzer displays a part of the measurement result which is designated for this display range in an enlarged manner. That is, in such a case, the measurement display which is displayed on the wavelength axis is set to have a narrower range than the measurement scale setting section under condition that the measurement is performed; therefore, the wavelength range for the measurement result is enlarged.

However, in such a conventional optical spectrum analyzer, the measurement scale is changed so as to set the wavelength range for the measurement result which is displayed as the measurement display such as the display range for the measurement result; thus, it is not possible to realize a desirable operability. That is, if it is necessary to perform the measurement operation by the measurement scale which is used previously, it is necessary to set the same wavelength range as the previous measurement scale again; thus, such an operation is undesirable from an operability point of view.

Recently, in particular, a signal light (WDM: Wavelength Division Multiplex) in which a plurality of lights which have a plurality of different wavelengths are multiplexed has been used more commonly and rapidly along with an increase in the transmitted information amount for the optical information communication which is caused by a prevalence of Internet, etc., in the signal light for the optical information communication as an example for an object for measurement of the optical spectrum analyzer. In the optical communication in which the WDM is used, the lights which have different wavelengths are handled as channels respectively; thus, the transmission capacity increases by increasing the multiplexed channels. A range for the wavelength which is contained in the signal light which is used in such an optical information communication is large together with the increase of the number of the channels. In addition, if the optical spectrum for such an signal light is measured by the optical spectrum analyzer, the operator sets the measurement scale in a wide range so as to measure a plurality of channels in a single measurement operation. In addition, individual channels are displayed in an enlarged manner so as to analyze an optical level and a spectrum width of each channel after the measurement.

However, in the conventional optical spectrum analyzer, it is necessary to change the measurement scale within a displayed wavelength range so as to display each channel in an enlarged manner after the measurement. Therefore, if it is necessary to display each channel in an enlarged manner again and measure the wide range of wavelength after measuring the wide range of wavelength, it is necessary to set the measurement scale again; thus, such an operation is undesirable from an operability point of view. That is, there is a problem in the conventional technology that it is not possible to change the display range without changing the measurement scale. In other words, it is not possible to display the wavelength axis either in a contracted manner or an enlarged manner.

DISCLOSURE OF THE INVENTION

The present invention was made in consideration of the above problems. An object of the present invention is to improve an operability of the measurement device by freely changing the display range for the measurement result without changing the measurement scale.

In order to achieve the above object, the present invention adapts a structure for a measurement device for measuring a predetermined physical quantity which is contained in the measurement signal over a predetermined measurement range which relates to a specific property for the physical quantity according to the measurement signal which is obtained from an object for measurement so as to display the measurement result as an image in a measurement display which comprises a display range setting section (V) which sets the measurement range, a measurement display generating section (6) which generates the measurement display by using the measurement result in a display range which is set by the measurement range setting section (V) among the measurement result which is measured over the measurement range which is set by the measurement range setting section (M), and a display section (7) which displays the measurement display which is generated by the measurement display generating section (6).

Also, a structure in which the measurement device is an electric spectrum analyzer which measures an electric signal level of an electric signal which is input as a measurement signal over a predetermined frequency range which relates to the frequency as a specific property for the electric signal is adapted for a second aspect which relates to the measurement device in the above first aspect of the present invention.

Also, a structure in which the measurement device is an electric spectrum analyzer which measures an optical intensity of an electric signal which is input as a measurement signal over a predetermined frequency range or a wavelength range which relate to the frequency or the wavelength as specific properties for the optical intensity. is adapted for a third aspect which relates to the measurement device in the above first aspect of the present invention.

Also, a structure in which the display range setting section (V) contains the measurement range which is set by the measurement range setting section (M) as a measurement range is adapted in any one of the first to the third aspect of the present invention as a fourth aspect which relates to the measurement device.

A structure in which the display range is variable even if the measurement operation is repeated without changing the measurement range is adapted for a fifth aspect which relates to the measurement device in any one of the above first to the fourth aspects.

A structure in which the display range is a frequency range or a wavelength range which is an object of the analysis when an analyzing processing operation is performed for the measurement result is adapted for a sixth aspect which relates to the measurement device in any one of the above first to fourth aspects.

A structure in which the measurement device changes the display range synchronously according to a frequency value or a wavelength value and a level as results of the analyzing processing operation for the measurement result is adapted for a seventh aspect which relates to the measurement device in any one of the above first to fourth aspects.

Also, a structure in which, when the measurement range is changed in the measurement range setting section (M), the display range setting section (V) contains the changed measurement as the display range is adapted for an eighth aspect which relates to the measurement device in any one of the above first to fifth aspects.

A structure in which the display range setting section (V) is provided with a pointing device so as to set an area which is determined by a starting point and an ending point which are designated in the measurement display by the pointing device as the display range is adapted for a ninth aspect which relates to the measurement device in any one of the above first to sixth aspects.

A structure in which, when the display range is set as a part of the measurement range by the display range setting section (V), the measurement display generating section (6) generates the measurement display by using the measurement result in the display range and generates the measurement display as a subsidiary display by using the measurement result in the measurement range is adapted for a tenth aspect which relates to the measurement device in any one of the above first to seventh aspects.

A structure in which a display position of the subsidiary display, a display size, or a display transmission ratio are variable is adapted for an eleventh aspect which relates to the measurement device in the above tenth aspect.

A structure in which an area which indicates the display range is shown in the subsidiary display by a framed line is adapted for a twelfth aspect which relates to the measurement device in the above eleventh aspect.

A structure in which the display range is variable by freely moving the position of the framed line in the subsidiary display is adapted for a thirteenth aspect which relates to the measurement device in the above twelfth aspect.

On the other hand, as a first aspect, the present invention adapts a method for displaying a measurement result as a measurement display by measuring a predetermined physical quantity which is contained in the measurement signal over a predetermined measurement range which relates to a specific property for the physical quantity which comprises the steps of setting the display range of the measurement result separately from the measurement range, and displaying the measurement result as an image according to the display range.

Also, a structure in which an electric signal level of an electric signal which is input as a measurement signal is measured over a predetermined frequency range which relates to the frequency as a specific property for the electric signal is adapted for a second aspect which relates to a method for displaying the measurement result in the above first aspect.

Also, a structure in which an optical intensity of an electric signal which is input as a measurement signal is measured over a predetermined frequency range or a wavelength range which relate to the frequency or the wavelength as specific properties for the optical intensity. is adapted for a third aspect which relates to the measurement device in the above first aspect of the present invention is adapted for a third aspect which relates to a method for displaying the measurement result in the above first aspect.

A structure in which the display range is variable even if the measurement operation is repeated without changing the measurement range is adapted for a fourth aspect which relates to a method for displaying the measurement result in any one of the above first to the third aspects.

A structure in which the display range is a frequency range or a wavelength range which is an object of the analysis when an analyzing processing operation is performed for the measurement result is adapted for a fifth aspect which relates to a method for displaying the measurement result in any one of the above first to third aspects.

A structure in which the display range is changed synchronously according to a frequency value or a wavelength value and a level as results of the analyzing processing operation for the measurement result is adapted for a sixth aspect which relates to a method for displaying the measurement result in any one of the above first to third aspects.

A structure in which an area which is determined by a starting point and an ending point which are designated in the measurement display by the pointing device is set as the display range is adapted for a seventh aspect which relates to a method for displaying the measurement result in any one of the above first to sixth aspects.

A structure in which the display range is set for a part of the measurement range, the measurement display which corresponds to the display range is displayed as an image; and, in addition, the measurement display which corresponds to the measurement range is displayed as an image in a subsidiary display is adapted for an eighth aspect which relates to a method for displaying the measurement result in any one of the above first to seventh aspects.

A structure in which a display position of the subsidiary display, a display size, or a display transmission ratio are variable is adapted for a ninth aspect which relates to a method for displaying the measurement result in the above eighth aspect.

A structure in which an area which indicates the display range is shown in the subsidiary display by a framed line is adapted for a tenth aspect which relates to a method for displaying the measurement result in the above eighth aspect.

A structure in which the display range is variable by freely moving the position of the framed line in the subsidiary display is adapted for an eleventh aspect which relates to a method for displaying the measurement result in the above tenth aspect.

BEST MODE FOR CARRYING OUT THE INVENTION

An embodiment for a measurement device and a method according to the present embodiment for displaying a measurement result is explained with reference to drawings as follows. Here, in the present embodiment, the present invention is employed for an optical spectrum analyzer.

Figure 1:
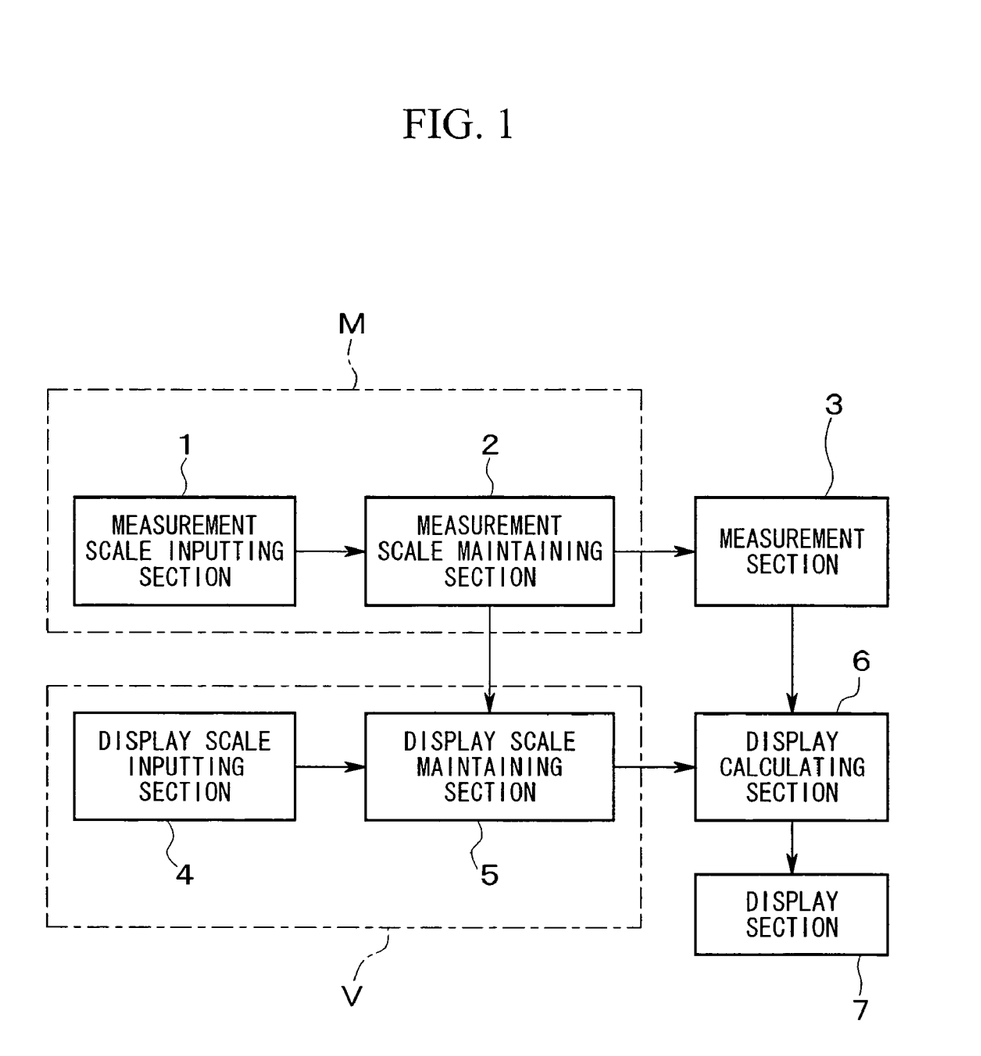
FIG. 1 is a block diagram for showing a structural function for an optical spectrum analyzer according to an embodiment of the present invention.

FIG. 1 is a block diagram for showing a structural function for an optical spectrum analyzer according to an embodiment of the present invention. In this drawing, a reference numeral 1 indicates a measurement scale inputting section. A reference numeral 2 indicates a measurement scale maintaining section. A reference numeral 3 indicates a measurement section. A reference numeral 4 indicates a display scale inputting section. A reference numeral 5 indicates a display scale maintaining section. A reference numeral 6 indicates a display calculating section (measurement display generating section). Also, a reference numeral 7 indicates a display section. Here, among these members, the measurement scale inputting section 1 and the measurement scale maintaining section 2 form a measurement scale setting section M. Also, the display scale inputting section 4 and the display scale maintaining section 5 form the display scale setting section V.

The measurement scale inputting section 1 serves for an operator to operate and input the measurement wavelength range as a measurement scale. For example, the measurement scale inputting section 1 is a hardware key such as a ten-key device or a pointing device such as a mouse. The measurement scale maintaining section 2 serves for maintaining the measurement scale which is input by the above described measurement scale inputting section 1 by the operator. For example, the measurement scale maintaining section 2 is a storage device such as a semiconductor memory, etc. The measurement section 3 serves for measuring an optical spectrum characteristics which indicates a relationship between an optical intensity of an optical signal (measurement light) and a wavelength which is input as a measurement signal from an object for measurement over the measurement scale which is maintained in the measurement scale maintaining section 2. For example, the measurement section 3 is formed by an spectrometer which disperses the measurement light into various wavelength component and an optical detector which detects an optical intensity of each of the wavelength component as an electric signal (detection signal).

The measurement scale inputting section 4 serves for an operator to operate and input the measurement wavelength range as a display scale. For example, the measurement scale inputting section 2 is a hardware key such as a ten-key device or a pointing device such as a mouse. The measurement scale maintaining section 5 serves for maintaining the measurement scale which is input by the above described measurement scale inputting section 4 by the operator. For example, the measurement scale maintaining section 2 is a storage device such as a semiconductor memory, etc.

In such a way, the display scale setting section V which is formed by such a display scale inputting section 4 and the display scale maintaining section 5 is disposed in the optical spectrum analyzer separately from the measurement scale setting section M which is formed by the above explained measurement scale inputting section 1 and the measurement scale maintaining section 2. Here, such a structure in which the display scale setting section V is disposed separately from the measurement scale setting section M is aimed for operating these two members separately from a functional point of view. It is acceptable if such a structure may be realized by performing a mode switching operation in a single hardware for the display scale setting section V and the measurement scale setting section M.

The display calculating section 6 generates a measurement display by using the measurement result for the wavelength range which is equivalent to the display scale which is stored in the display scale maintaining section 5 among the measurement result for the optical spectrum characteristics which is measured by the measurement section 3. Such a display calculating section 6 is formed by a central processing unit (CPU) which is operated according to a program for generating the measurement display. The display section 7 serves for displaying an image of the measurement display which is input from the display calculating section 6. For example, the display section 7 is a liquid crystal display device and a CRT device, etc.

Next, an operation of the present optical spectrum analyzer which has the above structure is explained with reference to FIGS. 2 to 7B.

Figure 2:
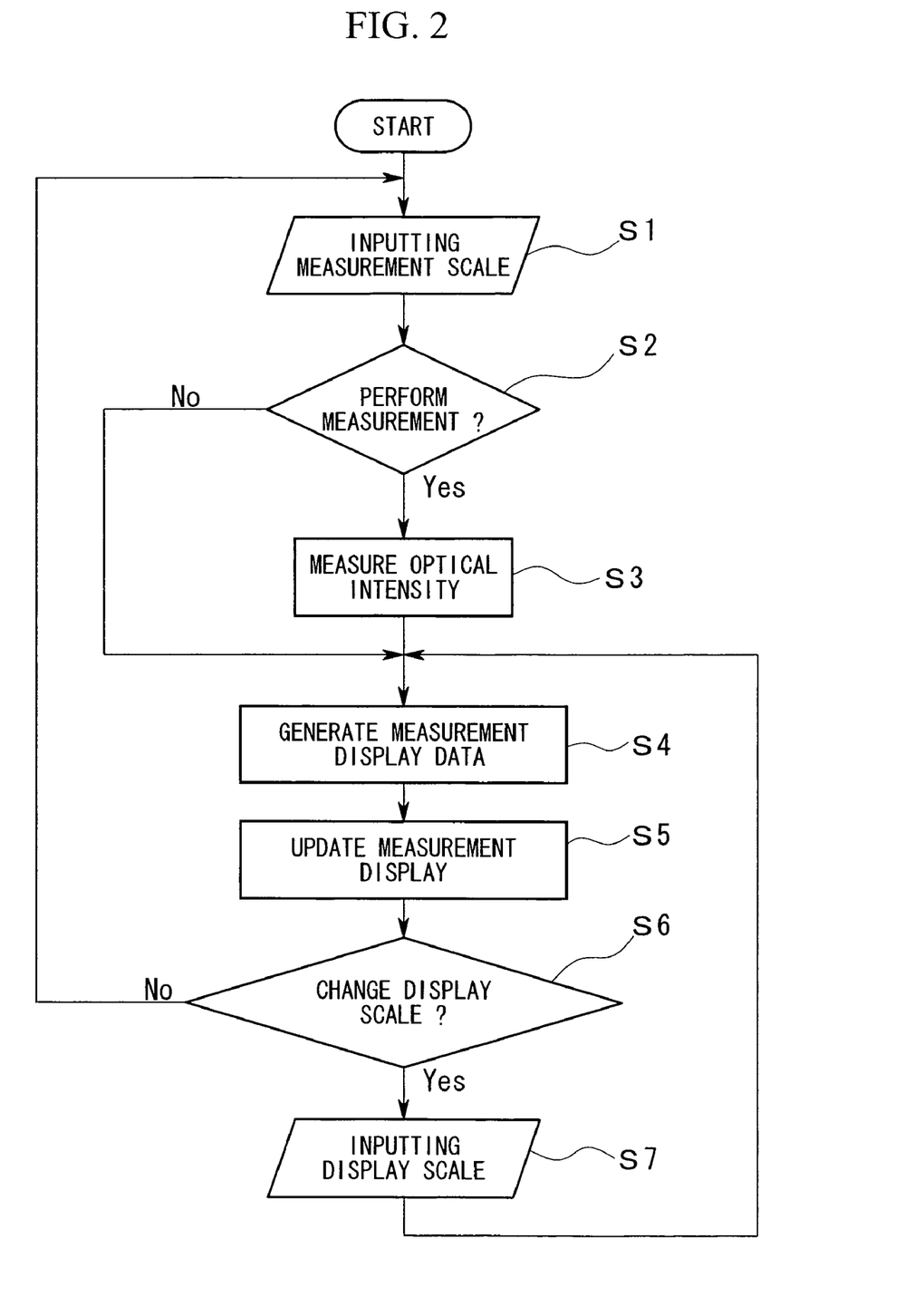
FIG. 2 is a first flow chart for showing a movement an optical spectrum analyzer according to an embodiment of the present invention.

FIG. 2 is a flow chart for showing an example of operations of an optical spectrum analyzer according to the present invention. When the optical spectrum characteristics of the measurement light is measured by using the present optical spectrum analyzer, the operator inputs the measurement wavelength range as the measurement scale into the present optical spectrum analyzer by using the measurement scale inputting section 1. The optical spectrum analyzer maintains the measurement wavelength range in the measurement scale maintaining section 2 when the measurement wavelength range is input from the measurement scale inputting section 1 (Step S1). Consequently, when a measurement starting command is input by the operator's operation for an operation section (not shown in the drawing) (Step S2), the measurement section 3 measures an optical intensity for each wavelength over the measurement wavelength range which is maintained in the measurement scale maintaining section 2.

The display calculating section 6 receives the optical intensity of each wavelength which is input from the measurement section 3 so as to store them as an optical intensity datum which corresponds to each wavelength in an inner memory. Furthermore, the display calculating section 6 reads out the optical intensity datum for the wavelength range which corresponds to the display scale which is maintained in the display scale maintaining section 5 from the inner memory so as to generate the measurement display data (Step S4). Consequently, the display calculating section 6 updates the measurement display by outputting the measurement display datum which is generated in such a way to the display section 7 (Step S5). Such a measurement display indicates a relationship for the optical intensity in each wavelength such that a horizontal axis is a wavelength axis which indicates each wavelength and a vertical axis is an optical intensity axis which indicates the optical intensity.

Here, the operator inputs a command for changing the display scale into the optical spectrum analyzer by operating the above operating section if the operator wants to expand or contract the wavelength axis in the measurement display. When a command for changing the display scale is operated and input from the operation section (Step S6) and a new display wavelength range is maintained in the display scale maintaining section 5 by operator's operation for the display scale inputting section 4 (Step S7), the display calculating section 6 generates a new measurement display datum by using the optical intensity data which corresponds to the new display wavelength range (Step S4) and updates the measurement display by outputting the new measurement display datum in the display section 7 (Step S5).

The optical spectrum analyzer maintains the measurement scale in the measurement scale maintaining section 2. On the other hand, the optical spectrum analyzer maintains the display scale in the display scale maintaining section 5. That is, the measurement scale and the display scale are set separately; therefore, the measurement scale is not changed even if the display scale is changed. Therefore, it is possible to change only the display scale independently without changing the setting condition of the measurement scale. That is, it is possible to expand the wavelength axis freely.

Here, the optical spectrum analyzer can set the display range variably even during performing the measurement operation by operating the display scale inputting section 4. That is, it is possible to display the measurement result in the display section 7 by change the display scale into a desirable wavelength range even during performing the measurement operation of the measurement light by a predetermined measurement scale repeatedly.

Figure 3:
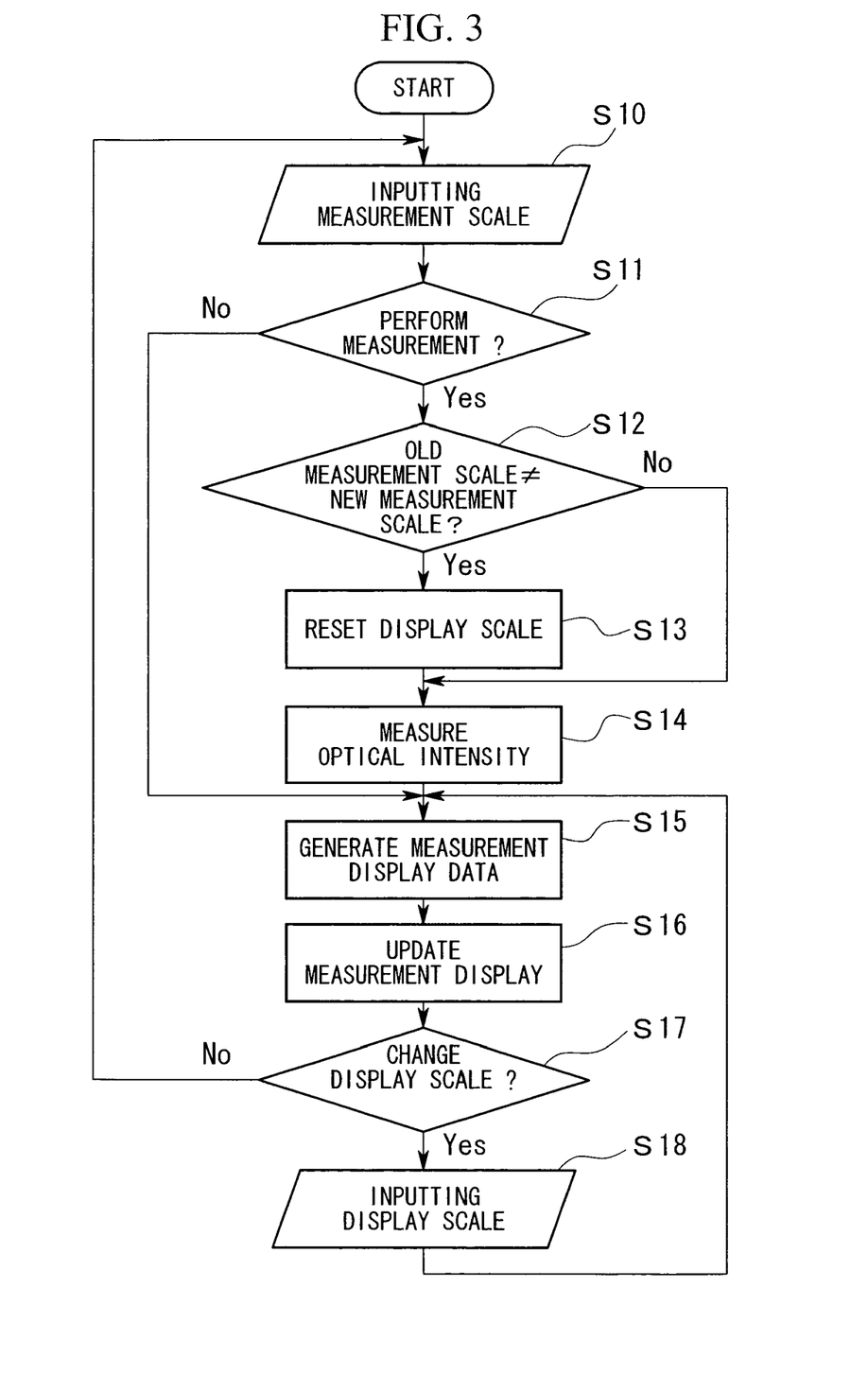
FIG. 3 is a second flow chart for showing a movement an optical spectrum analyzer according to an embodiment of the present invention.

Next, FIG. 3 is a flow chart for showing an example for other operation of the present optical spectrum analyzer.

In the above example for an operation which is shown in FIG. 2, the display scale is unstable when the measurement operation is performed by setting the measurement scale at first. That is, the measurement display datum is generated even if the display scale is not set when the measurement operation is performed after setting the measurement scale. In such a case, the display scale is unstable because the display scale is not set.

In contrast, the measurement display is displayed in the display section 7 so as to avoid such an unstable condition of the display scale in an example for an operation which is shown in FIG. 3. That is, the display calculating section 6 determines whether or not a new measurement scale which is input afterward (new measurement scale) is different from the measurement scale which is about to be input (old measurement scale) (Step S12) when the measurement starting command is input from the operation section (Step S10) and furthermore, a command for starting the measurement is input from the operation section (Step S11). Here, if the new measurement scale and the old measurement scale are different from each other, the display scale is reset (Step S13) by setting the measurement scale in the display scale. On the other hand, if the new measurement scale and the old measurement scale are the same, the display scale is not reset; thus, instead of that, a next operation such as a measuring operation is performed (Step S14). Here, the processing operations after this step S14 are similar to a case which is shown in FIG. 2.

According to such an example of the operations, when the measuring operation is performed under condition that the measurement scale is set at first, the old measurement scale is not fixed; therefore, the old measurement scale is different from the new measurement scale; thus, the display scale is reset by the measurement scale. Therefore, the display scale is not in an unfixed condition if the measurement scale is set at first and the measuring operation is executed. Also, when the measuring operation is performed under condition that the measurement scale is changed, the display scale is reset by the measurement scale automatically; therefore, data for an entire optical intensity in a measurement wavelength range are displayed on the measurement display automatically after performing the measurement.

Figure 4:
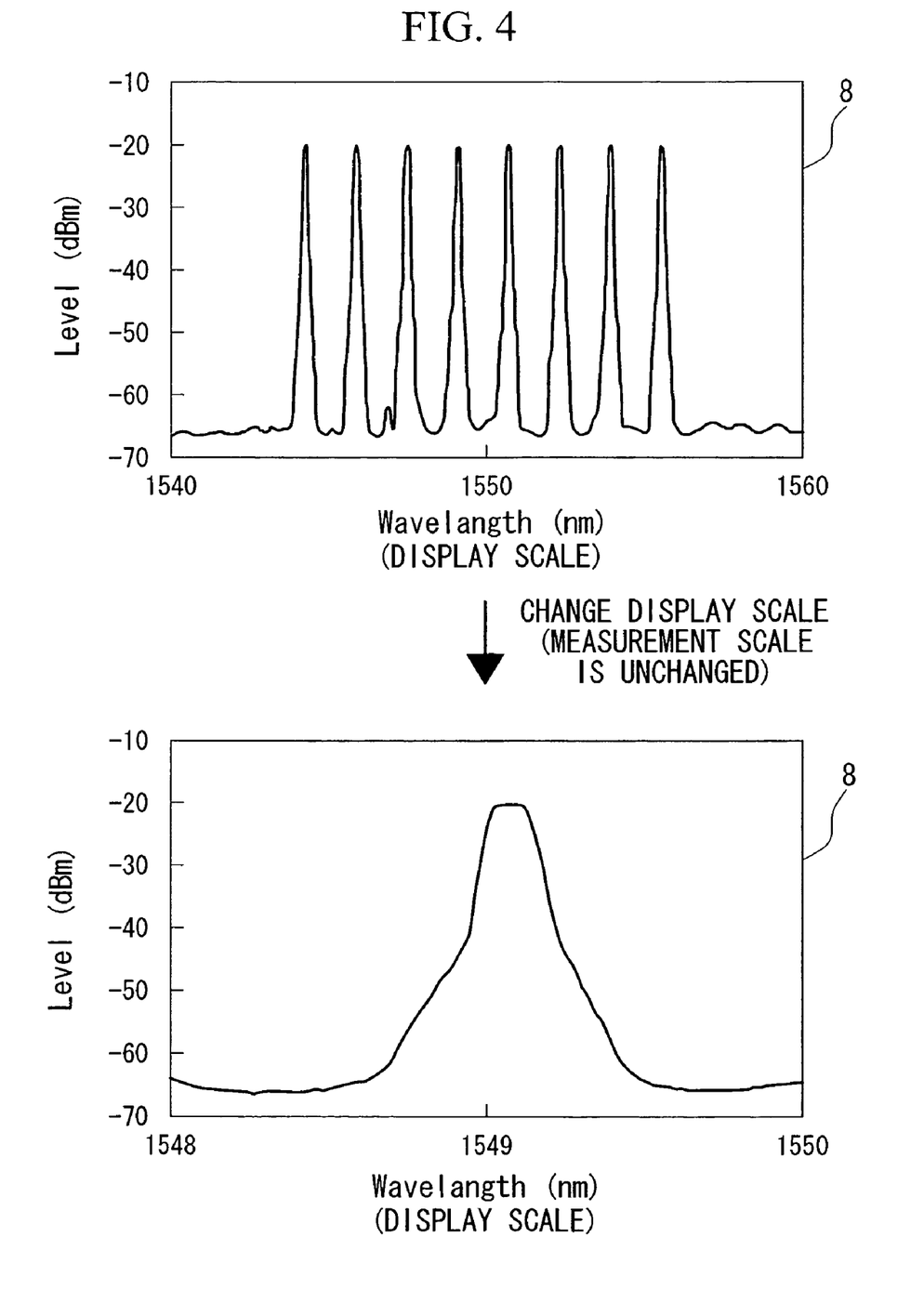
FIG. 4 is a graphic view for a displayed image which is displayed in a display section in an embodiment of the present invention.

Here, FIG. 4 is a view for showing a part of display area on the display section 7 such as a graphic view in a waveform display section 8. As shown in the drawings, the measurement display which is generated by the display calculating section 6 is displayed in the waveform display section 8 as an optical spectrum characteristics under condition that a horizontal axis indicates a wavelength (nm) and a vertical axis indicates an optical intensity (dBm) for each wavelength.

In this FIG. 4, a view in an upper stage is a measurement display under condition that the measurement scale is set in a range of wavelength 1540 nm to 1560 nm. The display scale is reset by the measurement scale when the measuring operation is performed; therefore, the wavelength of the display scale is the same as the wavelength of the measurement scale such as 1540 nm to 1560 nm. In this measurement display, eight signal components are displayed of which wavelength are different in a range of 1540 nm to 1560 nm. On the other hand, a view in a lower stage is an enlarged view for one of the above signal components under condition that the measurement display which is shown in the view in the upper stage is shown in the display section 7 such that the measurement scale is not changed; thus, only the display scale is reset to be in a range of 1548 nm to 1550 nm of wavelength.

In such a way, according to an example for operations which are shown in FIG. 3, it is possible to show an enlarged view of the waveform in the wavelength axial direction by changing only the display scale. Here, in the view in the lower stage in FIG. 4, the display scale is set so as to be narrower than the measurement scale. However, it is possible to display a contracted view of a waveform by setting the display scale so as to be larger than the measurement scale. Also, the measurement device such as an optical spectrum analyzer is provided with a function which performs an analyzing processing operation for a peak value and a spectrum width for an optical intensity with reference to the measurement result. It is possible to limit the range in which the analyzing processing operation is performed with in a range which is shown in the waveform display section 8 by using the display scale as a range of data which are object for the processing operation in the analyzing processing operation. Also, it is possible to change the display scale interactively according to the wavelength vale and the level value which are obtained as a result of the analyzing processing operation.

Figure 5A:
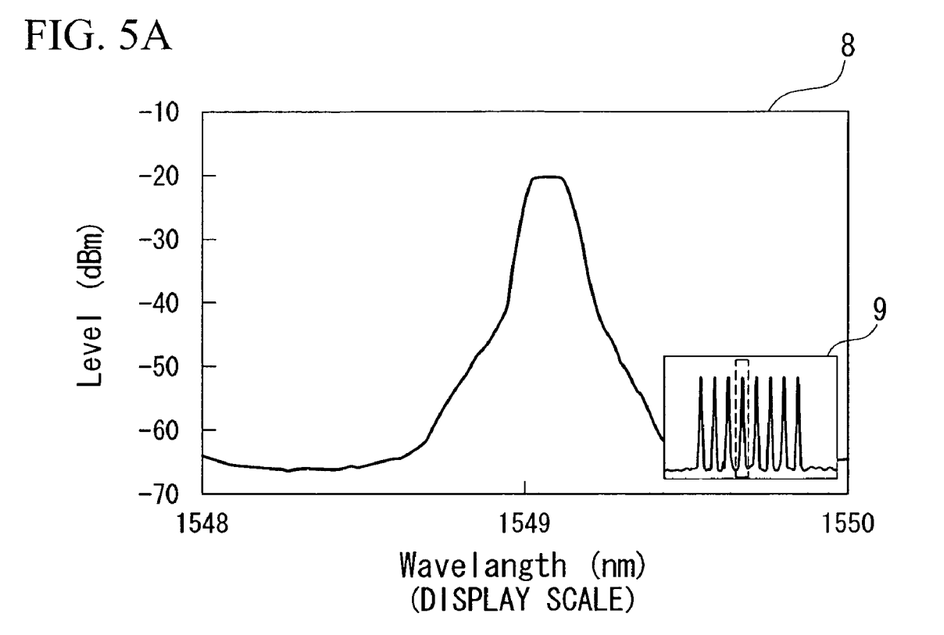
FIGS. 5A and 5B are graphic views for displayed images which are displayed in display section in an embodiment of the present invention.

Furthermore, FIGS. 5A and 5B are graphic views for showing other examples for the above display. FIG. 5A is a measurement display which is shown in the waveform display section 8 under condition that the display scale is set so as to be in a range of 1548 nm to 1550 nm after performing the measuring operation by setting the display scale so as to be in a range of 1540 nm to 1560 nm of wavelength. In this measurement display, the waveform in a range of 1548 nm to 1550 nm of display scale is displayed. On the other hand, the data of entire optical intensity in an entire measured range such as 1540 nm to 1560 nm are displayed in a subsidiary display as the display section 9 for an entire waveform. In such a way, it is possible to display a part of the measured optical intensity data in the waveform display section 8 in an enlarged manner and it is possible to observe the measurement result by displaying entire optical intensity data in the display section 9 for an entire waveform while comparing both the data shown in the waveform display section 8 and the data shown in the display section 9 for an entire waveform.

Here, an operator can set desirably for whether or not the display section 9 for an entire waveform should be displayed in the display section 7 according to the inputted operation from the operation section. Also, a display transmission ratio, a display position, and a display size when the display section 9 for an entire waveform can be set by the operation desirably according to the inputted operation from the operation section. Here, for a case in which the display section 9 for an entire waveform is displayed on the waveform display section 8, it is acceptable if the waveform display section 8 which is displayed therebeneath may be displayed in a transparent manner by setting the display transmission ratio of the display section 9 for an entire waveform desirably by the a person who performs a measuring operation.

Figure 5B:
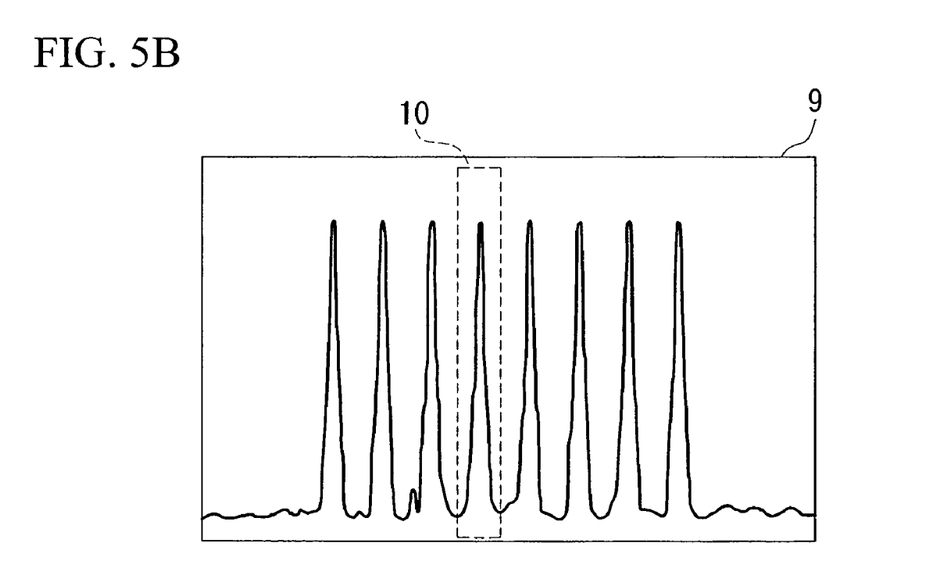

FIG. 5b is a view in which the display section 9 for an entire waveform as a subsidiary display is enlarged. As shown in this drawing, a range which is displayed in the waveform display section 8 in an enlarged manner is shown as a display range display section 10 in the display section 9 for an entire waveform. This display range display section 10 is displayed by, for example, a rectangular frame line in the display section 9 for an entire waveform. In such a way, the person who performs the measuring operation can confirm which part of the optical intensity data over an entire wavelength range of the measurement scale is displayed easily by displaying the display range display section 10 in the display section 9 for an entire waveform when a part of the measurement result is shown in an enlarged manner in the waveform display section 8.

Figure 6A:
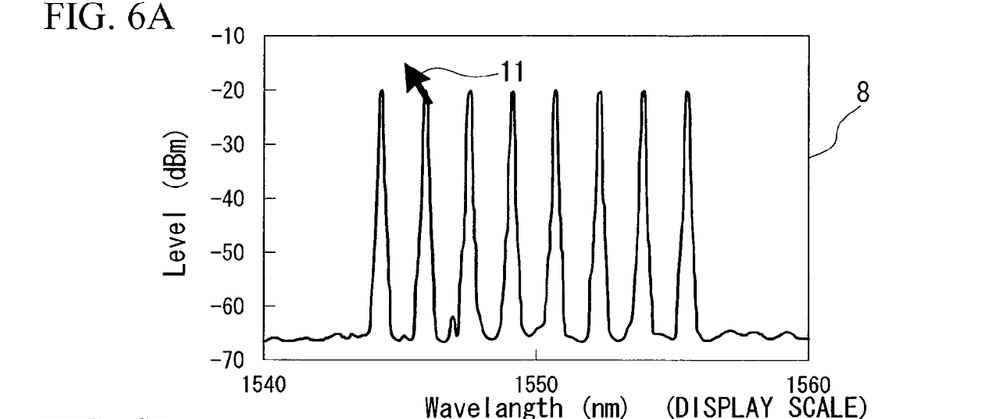
FIGS. 6A to 6C are first graphic views for showing how to set a display scale in an embodiment of the present invention.
Figure 6B:
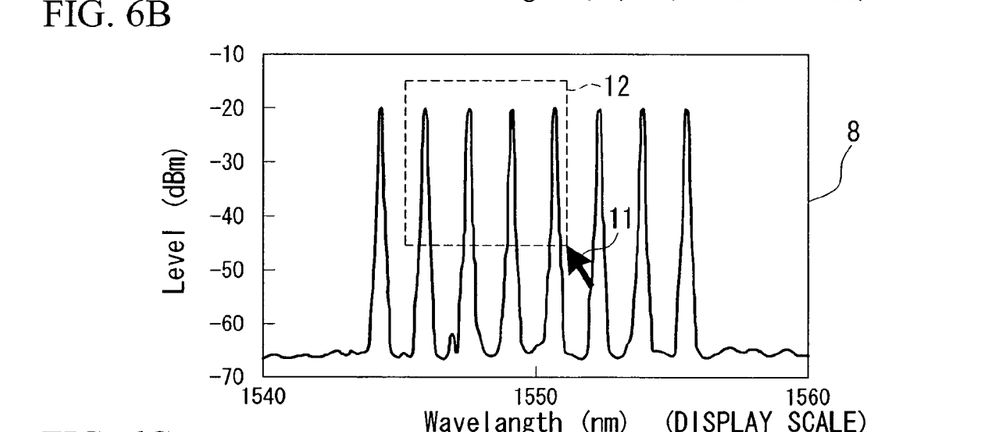
Figure 6C:
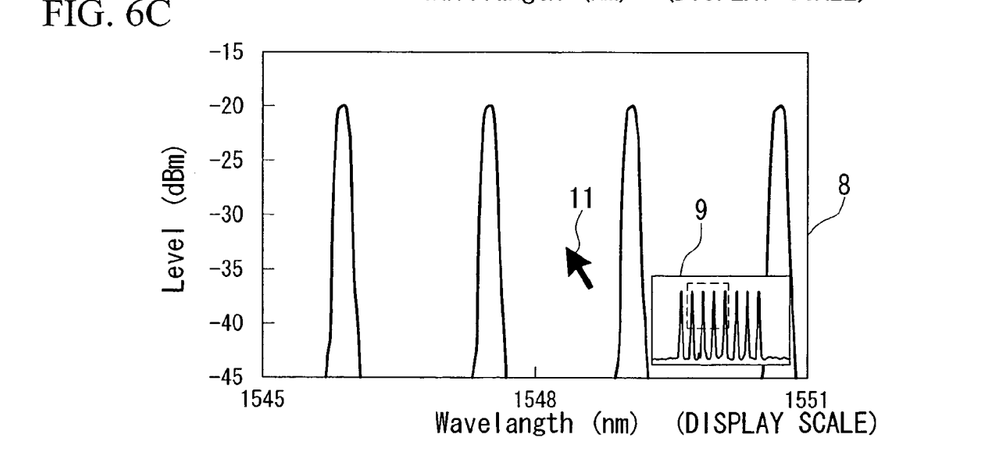

Next, FIGS. 6A to 6C are graphic views for showing a method for setting the display scale in the optical spectrum analyzer. The FIG. 6A shows a measurement display which is shown in the waveform display section 8 under condition that the measurement scale measured such that the measurement scale is set in a range of 1540 nm to 1560 nm of wavelength. In this waveform display section 8, the person who performs a measuring operation sets the display scale by designating a starting point and an ending point for a range of the display scale by using a mouse of the display scale inputting section 4.

That is, as shown in the drawing, the person who performs a measuring operation disposes a mouse cursor 11 at a starting point of a range which the person who performs a measuring operation desires to set as the display scale and furthermore moves the mouse cursor 11 to a position of the starting point of the range which the person who performs a measuring operation desires to set as the display scale while dragging a button of the mouse as shown in FIG. 6B. After that, the button of the mouse is untouched. As a result of this, an area 12 which is defined by the starting point and the ending point of the mouse cursor 11 is displayed in the waveform display section 8 in an enlarged manner as shown in FIG. 6C. Also, the display section 9 for an entire waveform is displayed in the subsidiary display. In such a way, by using a mouse as a display scale inputting section 4, it is possible to perform a display operation not only in the wavelength axial direction in an enlarged manner but also in the level axial direction in an enlarged manner easily.

Here, the display range display section 10 which corresponds to the area 12 which is defined by the starting point and the ending point which are designated by the above explained mouse is displayed in the display section 9 for an entire waveform. Here, it is acceptable if such a designation for the starting point and the ending point may be performed such that the vertical axis and/or the horizontal axis are designated numerically by using a ten-key device for the display scale inputting section 4. For example, it is acceptable if the wavelength for the starting point and the wavelength for the ending point in the horizontal axis may be set numerically. Otherwise, it is acceptable if a lower limit for the optical intensity and an upper limit for the optical intensity in the vertical axis (that is, a range of the optical intensity) may be set numerically.

Figure 7A:
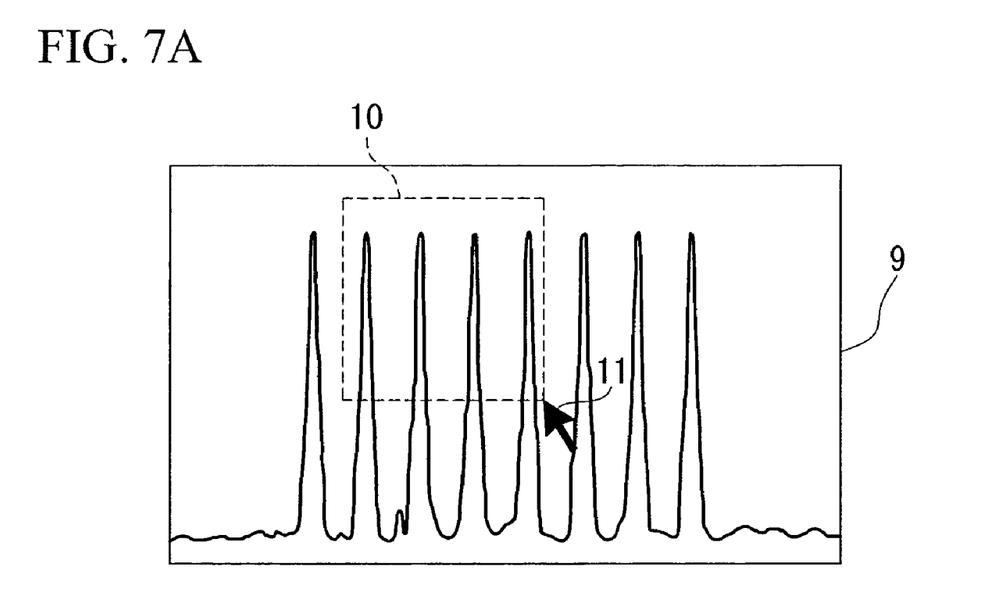
FIGS. 7A and 7B are second graphic views for showing how to set a display scale in an embodiment of the present invention.
Figure 7B:
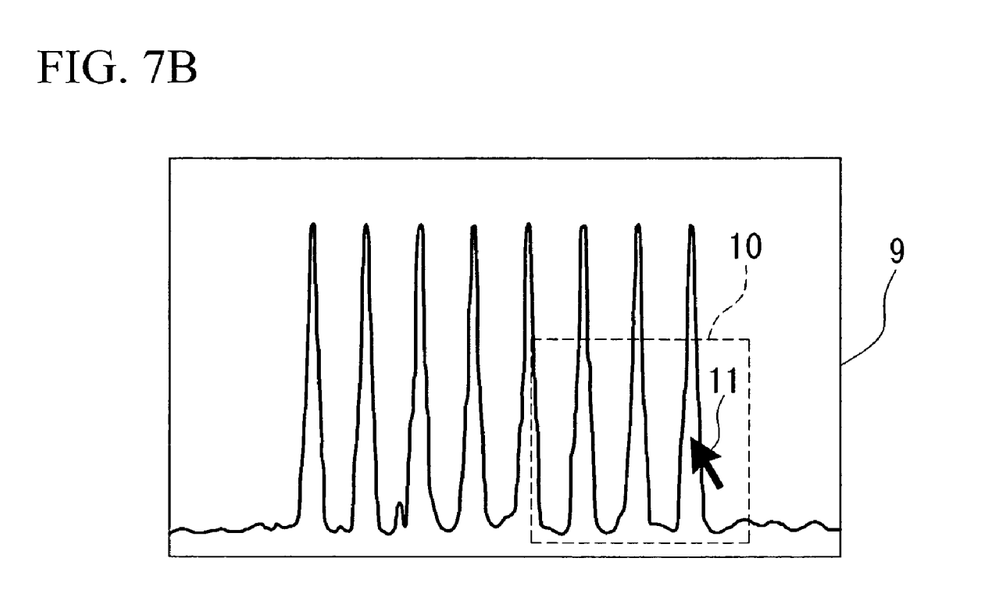

FIGS. 7A and 7B are views for showing another method for setting the display scale in the optical spectrum analyzer of the present invention. FIG. 7a is an enlarged for the display section 9 for an entire waveform. The display range display section 10 which shows a display range for the measurement result in the display section 9 for an entire waveform as explained above. In a case in which the display scale is set in the display section 9 for an entire waveform, the person who performs a measuring operation sets a position of the mouse cursor 11 so as to be inside of the display range display section 10 as shown in the drawing; thus, the button of the mouse is dragged. As a result of this, the waveform display section 10 is moved while maintaining a longitudinal and latitudinal size according to a movement of the mouse cursor 11 as shown in FIG. 7B.

Consequently, when the button of the mouse is untouched under condition that the display range display section 10 is moved to a position which the person who performs a measuring operation desires in the waveform display section 8, an area which corresponds to the display range display section 10 is displayed in the waveform display section 8. In such a way, it is possible to change the display scale by operating the mouse in the display section 9 for an entire waveform.

Here, in the above embodiment, the present invention is applied to the optical spectrum analyzer. However, it is possible to apply the present invention not only to such an optical spectrum analyzer but also to an electric spectrum analyzer which measures a frequency characteristics for an electric signal.

INDUSTRIAL APPLICABILITY

As explained above, the present invention adapts a structure for a measurement device for measuring a predetermined physical quantity which is contained in the measurement signal over a predetermined measurement range which relates to a specific property for the physical quantity according to the measurement signal which is obtained from an object for measurement so as to display the measurement result as an image in a measurement display which comprises a display range setting section which sets the measurement range, a measurement display generating section which generates the measurement display by using the measurement result in a display range which is set by the measurement range setting section among the measurement result which is measured over the measurement range which is set by the measurement range setting section, and a display section which displays the measurement display which is generated by the measurement display generating section. Therefore, it is possible to vary the display range of the measurement result freely without changing the measurement scale; thus, it is possible to enhance an operability of the measurement device.

The invention claimed is:

1. An optical spectrum analyzer for measuring a predetermined physical quantity which is contained in a measurement signal over a predetermined measurement range which relates to a specific property for the physical quantity according to the measurement signal which is obtained from an object for measurement so as to display the measurement result as an image in a measurement display comprising:
   a measurement range setting section (M) which sets the measurement range;
   a display range setting section (V) for setting the display range separately from the measurement range;
   a measurement display generating section (6) which generates the measurement display by using the measurement result in a display range which is set by the measurement range setting section (M) among the measurement result which is measured over the measurement range which is set by the measurement range setting section (M); and
   a display section (7) which displays the measurement display which is generated by the measurement display generating section (6).

2. The measurement device according to claim 1 which is an electric spectrum analyzer which measures an electric signal level of an electric signal which is input as a measurement signal over a predetermined frequency range which relates to the frequency as a specific property for the electric signal.

3. The measurement device according to claim 1 which is an electric spectrum analyzer which measures an optical intensity of an electric signal which is input as a measurement signal over a predetermined frequency range or a wavelength range which relate to the frequency or the wavelength as specific properties for the optical intensity.

4. The measurement device according to claim 1 wherein the display range setting section (V) contains the measurement range which is set by the measurement range setting section (M) as a measurement range.

5. The measurement device according to claim 1 wherein the display range is variable even if the measurement operation is repeated without changing the measurement range.

6. The measurement device according to claim 1 wherein the display range is a frequency range or a wavelength range which is an object of the analysis when an analyzing processing operation is performed for the measurement result.

7. The measurement device according to claim 1 which changes the display range synchronously according to a frequency value or a wavelength value and a level as results of the analyzing processing operation for the measurement result.

8. The measurement device according to claim 1 wherein, when the measurement range is changed in the measurement range setting section (M), the display range setting section (V) contains the changed measurement as the display range.

9. The measurement device according to claim 1 wherein the display range setting section (V) is provided with a pointing device so as to set an area which is determined by a starting point and an ending point which are designated in the measurement display by the pointing device as the display range.

10. The measurement device according to claim 1 wherein, when the display range is set as a part of the measurement range by the display range setting section (V), the measurement display generating section (6) generates the measurement display by using the measurement result in the display range and generates the measurement display as a subsidiary display by using the measurement result in the measurement range.

11. The measurement device according to claim 10 wherein a display position of the subsidiary display, a display size, or a display transmission ratio are variable.

12. The measurement device according to claim 10 wherein an area which indicates the display range is shown in the subsidiary display by a framed line.

13. The measurement device according to claim 12 wherein the display range is variable by freely moving the position of the framed line in the subsidiary display.

14. A method for displaying an optical spectrum by measuring a predetermined physical quantity which is contained in the measurement signal over a predetermined measurement range which relates to a specific property for the physical quantity comprising, the steps of:
   setting the display range of the measurement result separately from the measurement range; and
   displaying the measurement result as an image according to the display range,
   wherein an electric signal level of an electric signal which is input as a measurement signal is measured over a predetermined frequency range which relates to the frequency as a specific property for the electric signal.

15. The method for displaying the measurement result according to claim 14 wherein an optical intensity of an electric signal which is input as a measurement signal is measured over a predetermined frequency range or a wavelength range which relate to the frequency or the wavelength as specific properties for the optical intensity.

16. The method for displaying the measurement result according to claim 14 wherein the display range is variable even if the measurement operation is repeated without changing the measurement range.

17. The method for displaying the measurement result according to claim 14 wherein the display range is a frequency range or a wavelength range which is an object of the analysis when an analyzing processing operation is performed for the measurement result.

18. The method for displaying the measurement result according to claim 14 wherein the display range is changed synchronously according to a frequency value or a wavelength value and a level as results of the analyzing processing operation for the measurement result.

19. The method for displaying the measurement result according to claim 14 wherein an area which is determined by a starting point and an ending point which are designated in the measurement display by the pointing device is set as the display range.

20. The method for displaying the measurement result according to claim 14 wherein: the display range is set for a part of the measurement range, the measurement display which corresponds to the display range is displayed as an image; and, in addition, the measurement display which corresponds to the measurement range is displayed as an image in a subsidiary display.

21. The measurement device according to claim 20 wherein a display position of the subsidiary display, a display size, or a display transmission ratio are variable.

22. The method for displaying the measurement result according to claim 20 wherein an area which indicates the display range is shown in the subsidiary display by a framed line.

23. The method for displaying the measurement result according to claim 22 wherein the display range is variable by freely moving the position of the framed line in the subsidiary display.

* * * * *